United States Patent
Wu et al.

(10) Patent No.: US 11,621,199 B2
(45) Date of Patent: Apr. 4, 2023

(54) SILICIDE FORMATION FOR SOURCE/DRAIN CONTACT IN A VERTICAL TRANSPORT FIELD-EFFECT TRANSISTOR

(71) Applicant: International Business Machines Corporation, Armonk, NY (US)

(72) Inventors: Heng Wu, Guilderland, NY (US); Su Chen Fan, Cohoes, NY (US); Ruilong Xie, Niskayuna, NY (US); Huai Huang, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/458,777

(22) Filed: Aug. 27, 2021

(65) Prior Publication Data
US 2021/0391224 A1    Dec. 16, 2021

Related U.S. Application Data

(63) Continuation of application No. 16/506,339, filed on Jul. 9, 2019, now Pat. No. 11,158,543.

(51) Int. Cl.
*H01L 21/8238* (2006.01)
*H01L 27/092* (2006.01)
(Continued)

(52) U.S. Cl.
CPC ............. *H01L 21/823814* (2013.01); *H01L 21/26513* (2013.01); *H01L 21/28518* (2013.01);
(Continued)

(58) Field of Classification Search
CPC ....... H01L 21/823814; H01L 21/26513; H01L 21/28518; H01L 21/324; H01L 21/823871;
(Continued)

(56) References Cited

U.S. PATENT DOCUMENTS 8,154,025 B2   4/2012   Snyder et al.
9,117,692 B2   8/2015   Park et al.
(Continued)

FOREIGN PATENT DOCUMENTS

WO    2007120324 A2    10/2007

OTHER PUBLICATIONS

H. Elahipanah et al., "A Wafer-Scale Ni-Salicide Contact Technology on n-Type 4H—SiC," ECS Journal of Solid State Science and Technology, Mar. 3, 2017, pp. 197-200, vol. 6, No. 4.
(Continued)

*Primary Examiner* — Ahmed N Sefer
(74) *Attorney, Agent, or Firm* — Ryan, Mason & Lewis, LLP

(57) ABSTRACT

A method for manufacturing a semiconductor device includes forming a first vertical transistor structure in a first device region on a substrate, and forming a second vertical transistor structure in a second device region on the substrate. The first vertical transistor structure includes a first plurality of fins, and the second vertical transistor structure includes a second plurality of fins. A plurality of first source/drain regions are grown from upper portions of the first plurality of fins, and a contact liner layer is formed on the first source/drain regions. The method further includes forming a plurality of first silicide portions from the contact liner layer on the first source/drain regions, and forming a plurality of second silicide portions on a plurality of second source/drain regions extending from upper portions of the second plurality of fins. The second silicide portions have a different composition than the first silicide portions.

20 Claims, 16 Drawing Sheets

(51) Int. Cl.
*H01L 29/08* (2006.01)
*H01L 29/45* (2006.01)
*H01L 29/78* (2006.01)
*H01L 21/265* (2006.01)
*H01L 21/324* (2006.01)
*H01L 29/66* (2006.01)
*H01L 21/285* (2006.01)

(52) U.S. Cl.
CPC .... *H01L 21/324* (2013.01); *H01L 21/823871* (2013.01); *H01L 21/823885* (2013.01); *H01L 27/092* (2013.01); *H01L 29/0847* (2013.01); *H01L 29/45* (2013.01); *H01L 29/665* (2013.01); *H01L 29/66545* (2013.01); *H01L 29/66666* (2013.01); *H01L 29/7827* (2013.01); *H01L 29/7848* (2013.01)

(58) Field of Classification Search
CPC ........... H01L 21/823885; H01L 27/092; H01L 29/0847; H01L 29/45; H01L 29/665; H01L 29/66545; H01L 29/66666; H01L 29/7827; H01L 29/7848; H01L 29/0676; H01L 29/775; H01L 21/76855; H01L 21/76843; H01L 21/76865; H01L 21/76897; H01L 29/401; H01L 29/41741
See application file for complete search history.

(56) References Cited

U.S. PATENT DOCUMENTS

| | | |
|---|---|---|
| 9,437,495 B2 | 9/2016 | Lee et al. |
| 9,559,013 B1 | 1/2017 | Balakrishnan et al. |
| 9,653,465 B1 | 5/2017 | Balakrishnan et al. |
| 9,997,418 B2 | 6/2018 | Pranatharthiharan et al. |
| 10,103,247 B1 | 10/2018 | Xie et al. |
| 10,566,246 B1 | 2/2020 | Wu et al. |
| 10,685,888 B2 | 6/2020 | Adusumilli et al. |
| 2006/0163670 A1 | 7/2006 | Ellis-Monaghan et al. |
| 2014/0210011 A1 | 7/2014 | Baraskar et al. |
| 2015/0137067 A1 | 5/2015 | Colinge et al. |
| 2016/0197074 A1* | 7/2016 | Lee ................. H01L 21/823871 257/369 |
| 2017/0077248 A1 | 3/2017 | Eom et al. |
| 2017/0117277 A1 | 4/2017 | Tsai et al. |
| 2017/0352559 A1 | 12/2017 | Liu et al. |
| 2018/0005903 A1 | 1/2018 | Basker et al. |
| 2018/0006118 A1 | 1/2018 | Mallela et al. |
| 2018/0053821 A1 | 2/2018 | Mallela et al. |
| 2018/0068857 A1* | 3/2018 | Adusumilli ....... H01L 29/66742 |
| 2018/0337260 A1* | 11/2018 | Fan .................. H01L 21/76895 |
| 2019/0172927 A1 | 6/2019 | Jagannathan et al. |
| 2020/0013681 A1 | 1/2020 | Lee et al. |
| 2020/0091011 A1 | 3/2020 | Khaderbad et al. |

OTHER PUBLICATIONS

S. Zollner et al., "Dual Silicide SOI CMOS Integration with Low-Resistance PtSi PMOS Contacts," IEEE International SOI Conference, Oct. 1-4, 2007, 2 pages.

Y.-T. Wu et al., "Nickel/Platinum Dual Silicide Axial Nanowire Heterostructures with Excellent Photosensor Applications," Nano Letters, Feb. 10, 2016, pp. 1086-1091, vol. 16, No. 2.

List of IBM Patents or Patent Applications Treated as Related.

* cited by examiner

100

SILICIDE FORMATION FOR SOURCE/DRAIN CONTACT IN A VERTICAL TRANSPORT FIELD-EFFECT TRANSISTOR

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical transport field effect transistors (VTFETs) are becoming viable device options for semiconductor devices beyond 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

In conventional VTFET manufacturing processes, top junction amorphous silicon (a-Si) removal and top junction ion implantation for an n-type field effect transistor (NFET) uses two lithography steps due to difficulty maintaining an organic planarization layer (OPL) during a-Si removal.

In current processing, the silicide used for top source/drain regions in VTFETs is the same for p-type field effect transistors (PFETs) and for NFETs, which negatively impacts contact resistivity of the PFETs.

SUMMARY

According to an exemplary embodiment of the present invention, a method for manufacturing a semiconductor device includes forming a first vertical transistor structure in a first device region on a substrate, and forming a second vertical transistor structure in a second device region on the substrate. The first vertical transistor structure includes a first plurality of fins, and the second vertical transistor structure includes a second plurality of fins. A plurality of first source/drain regions are grown from upper portions of the first plurality of fins, and a contact liner layer is formed on the plurality of first source/drain regions. The method further includes forming a plurality of first silicide portions from the contact liner layer on the plurality of first source/drain regions, and forming a plurality of second silicide portions on a plurality of second source/drain regions extending from upper portions of the second plurality of fins. The plurality of second silicide portions have a different composition than the plurality of first silicide portions.

According to an exemplary embodiment of the present invention, a semiconductor device includes a first vertical transistor structure in a first device region on a substrate, and a second vertical transistor structure in a second device region on the substrate. The first vertical transistor structure includes a first plurality of fins, and the second vertical transistor structure includes a second plurality of fins. A plurality of first source/drain regions are on upper portions of the first plurality of fins, and a plurality of second source/drain regions are on upper portions of the second plurality of fins. The semiconductor device further includes a plurality of first silicide portions on the plurality of first source/drain regions, and a plurality of second silicide portions on the plurality of second source/drain regions. The plurality of second silicide portions have a different composition than the plurality of first silicide portions. The first and second device regions respectively include n-type and p-type transistor regions.

According to an exemplary embodiment of the present invention, a method for manufacturing a semiconductor device includes forming a first vertical transistor structure in a first device region on a substrate, and forming a second vertical transistor structure in a second device region on the substrate. The first vertical transistor structure includes a first plurality of fins, and the second vertical transistor structure includes a second plurality of fins. In the method, at least one dielectric layer is formed over the first and second vertical transistor structures, a portion of the at least one dielectric layer over the first vertical transistor structure is removed to form an opening, and upper portions of the first plurality of fins are exposed through the opening. The method further includes growing a plurality of first source/drain regions from the upper portions of the first plurality of fins, and forming a contact liner layer on the plurality of first source/drain regions at a bottom of the opening. A plurality of first silicide portions are formed from the contact liner layer on the plurality of first source/drain regions, and a plurality of second silicide portions are formed on a plurality of second source/drain regions extending from upper portions of the second plurality of fins. The plurality of second silicide portions are formed in a different silicidation step than the plurality of first silicide portions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
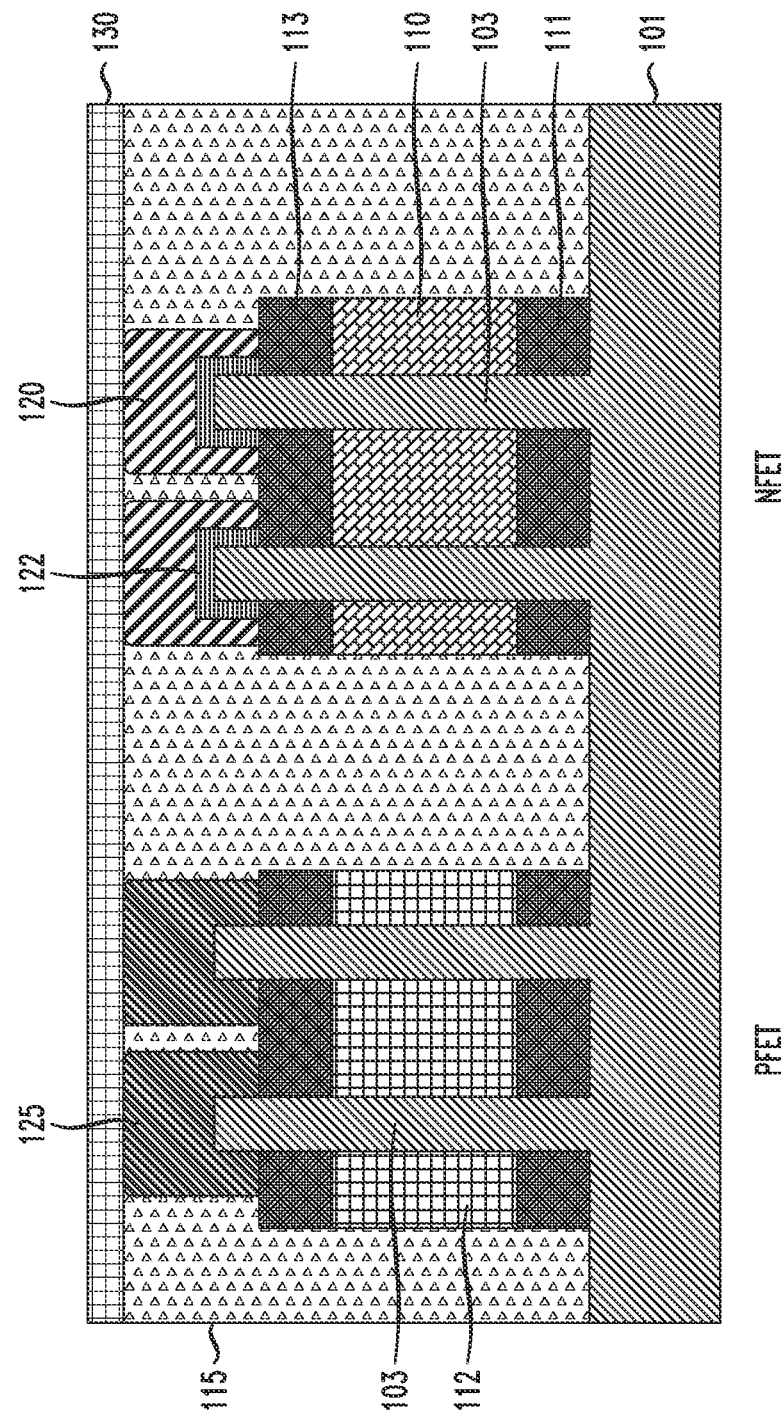
FIG. 1 is a cross-sectional view illustrating liner layer formation on PFET and NFET vertical transistor structures, in a method of manufacturing a semiconductor device, according to an exemplary embodiment of the present invention.

Exemplary embodiments of the invention will now be discussed in further detail with regard to semiconductor devices and methods of manufacturing same and, in particular, to VTFET devices where ion implantation, source/drain epitaxial growth and silicide formation in an NFET region follow the same patterning step.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for VTFETs, which use a dual silicide process applied in connection with the top source/drain regions of a VTFET. In the dual silicide process, silicide formation follows top junction ion implantation and epitaxial growth in an NFET region, enabling simpler processing and better device performance. According to one or more embodiments, a single patterning scheme forms an NFET silicide for a top source/drain contact earlier in a manufacturing process than in the conventional art. A PFET silicide including a different composition than the NFET silicide is formed in a subsequent step after formation of the NFET silicide. Top epitaxial junction ion implantation, epitaxial source/drain region growth and silicide formation are performed after the same lithographic patterning step without an additional patterning process in the NFET region.

Referring to FIG. 1, PFET and NFET vertical transistor structures are shown. The PFET and NFET vertical transistor structures are formed on a semiconductor substrate 101 including a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 103, can be formed by patterning a semiconductor layer into the fins 103. The semiconductor layer can include, but is not necessarily limited to, Si, SiGe or III-V materials, and may be epitaxially grown. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. In addition, although four fins 103 are shown in the figures for ease of explanation, more or less than four fins can be formed.

Bottom and top spacer layers 111 and 113 are formed under and over gate metal layers 110 and 112 for NFET and PFET regions. The bottom and top spacer layers 111 and 113 include, but are not necessarily limited to, silicon boron nitride (SiBN), siliconborocarbonitride (SiBCN), silicon oxycarbonitride (SiOCN), silicon nitride (SiN) or silicon oxide ($SiO_x$), where x is, for example, 2 in the case of silicon dioxide ($SiO_2$), or 1.99 or 2.01. According to an embodiment, the spacer layers 111 and 113 are deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE.

The gate metal layer 110 in the NFET region comprises an n-type gate metal layer, for example, an n-type work function metal layer. The n-type work function metal layer 110 includes, but is not necessarily limited to, titanium nitride (TiN), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. The work function metal layers 110 are deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering, and/or plating, followed by planarization, such as, for example, chemical mechanical polishing (CMP).

The gate metal layer 112 in the PFET region comprises a p-type gate metal layer, for example, a p-type work function metal layer including, but not necessarily limited to, titanium nitride (TiN), tantalum nitride (TaN) or ruthenium (Ru). The work function metal layer 112 is deposited using, for example, deposition techniques including, but not limited to, CVD, PECVD, RFCVD, PVD, ALD, MLD, MBD, PLD, LSMCD, sputtering, and/or plating, followed by planarization, such as, for example, CMP.

Top source/drain regions 125 extend from the fins 103 in the PFET region. The top source/drain regions 125 are epitaxially grown in epitaxial growth processes from the upper portions of the fins 103. The epitaxially grown top source/drain regions 125 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the top source/drain regions 125 include boron doped SiGe.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In the NFET region, dummy source/drain regions including an amorphous silicon (a-Si) layer 120 and a dielectric layer 122 are formed on the fins 103. The dielectric layer 122 comprises, for example, an oxide and lines an outer surface of exposed portions of the fins 103 above the top spacer layer 113. The dielectric layers 122 separate the crystalline material of the fins 103 from the a-Si layers 120. The a-Si deposition can be performed using, for example, flowable chemical vapor deposition (FCVD).

The vertical transistor structures in the PFET and NFET regions are surrounded by a dielectric layer 115 formed on the substrate 101. The dielectric layer 115 includes, but is not necessarily limited to, $SiO_x$, low-temperature oxide (LTO), high-temperature oxide (HTO), flowable oxide (FOX), or some other oxide. The dielectric layer 115 can be deposited using deposition techniques including, but not limited to, CVD, PECVD, RFCVD, PVD, ALD, MLD, MBD, PLD, LSMCD, and/or sputtering, followed by a planarization process, such as, CMP to remove excess dielectric material.

A liner layer 130 is formed on the dielectric layer 115 and vertical transistor structures in the PFET and NFET regions. According to one or more embodiments, the liner layer 130 includes a dielectric material, such as, a nitride (e.g., SiN, SiBN, SiBCN, SiOCN), or other material which can be selectively removed with respect to the material of the dielectric layer 115 and/or subsequently deposited dielectric layer 116 (see FIG. 2). The liner layer 130 can be deposited using deposition techniques including, but not limited to, CVD, PECVD, RFCVD, PVD, ALD, MLD, MBD, PLD, LSMCD, and/or sputtering, followed by a planarization process, such as, CMP. A thickness (e.g., vertical height with respect to the underlying dielectric layer 115) of the liner layer 130 is about 5 nm to about 15 nm.

Figure 2:
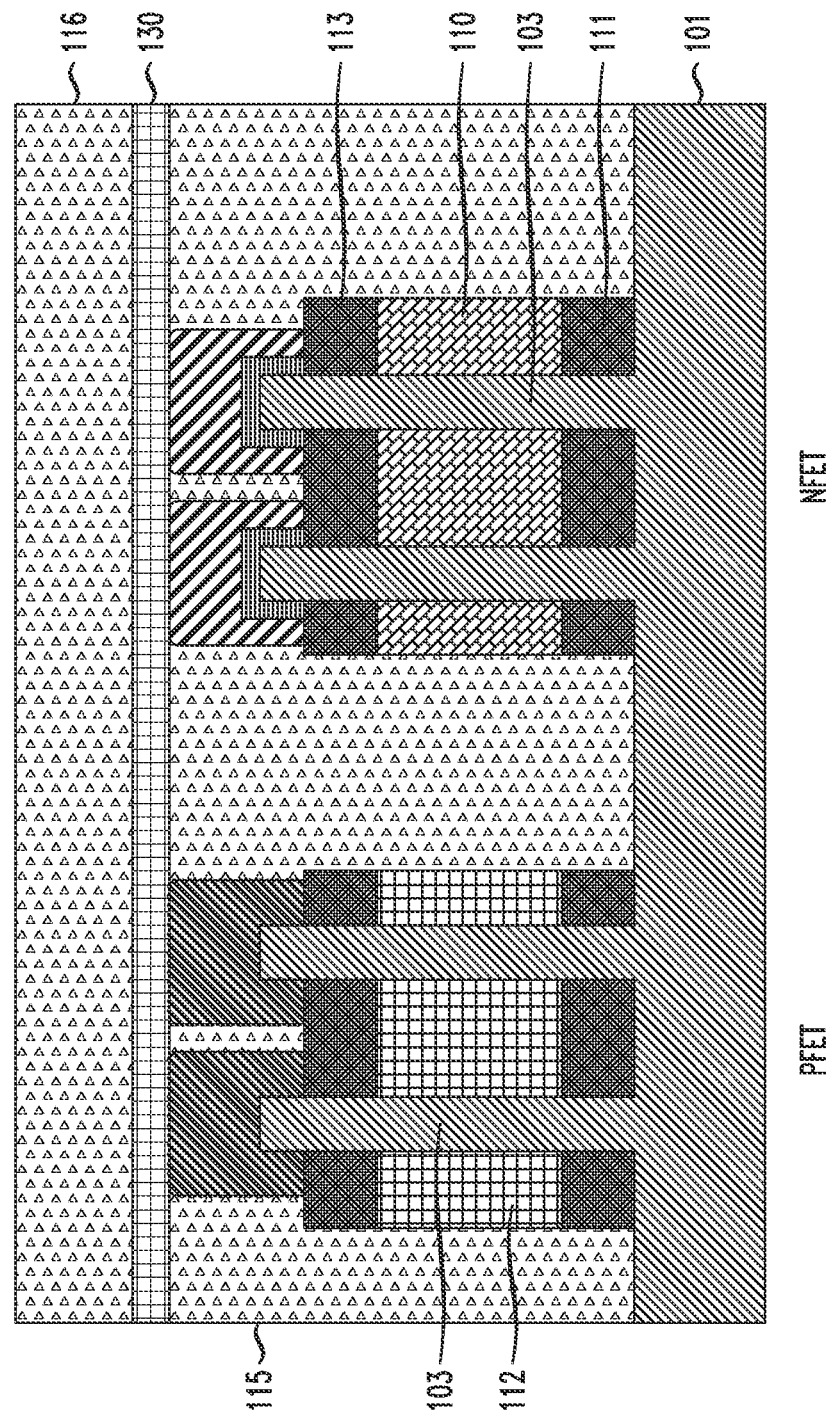
FIG. 2 is a cross-sectional view illustrating dielectric layer deposition in a method of manufacturing a semiconductor device, according to an exemplary embodiment of the present invention.

Referring to FIG. 2, a dielectric layer 116 is deposited on the liner layer 130. The dielectric layer 116 includes, but is not necessarily limited to, the same or similar material as the dielectric layer 115, and can be deposited using the same or similar deposition techniques as used for the dielectric layer 115, followed by a planarization process, such as, CMP. A thickness (e.g., vertical height with respect to the underlying liner layer 130) of the dielectric layer 116 is about 15 nm to about 35 nm.

Figure 3:
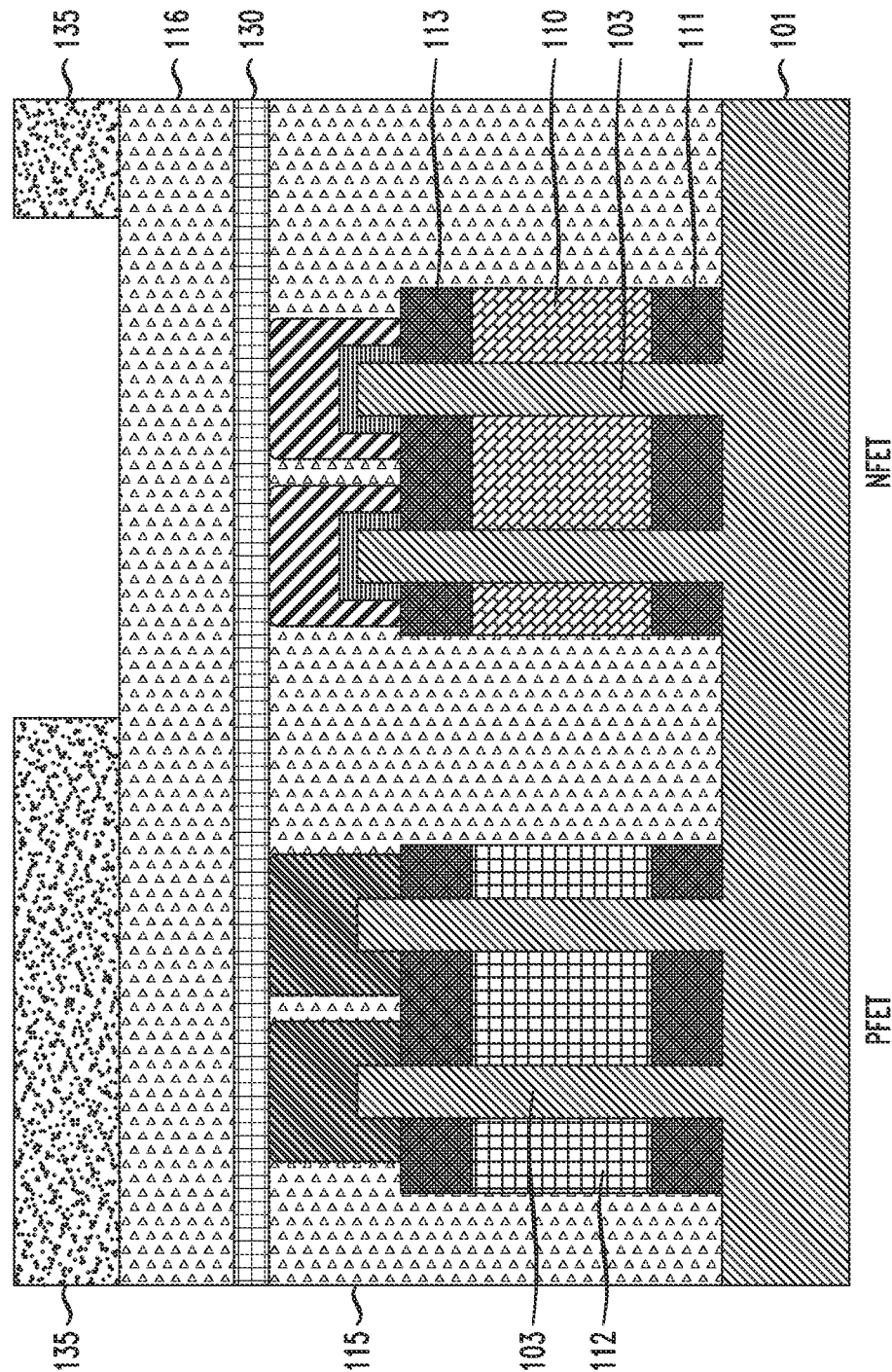
FIG. 3 is a cross-sectional view illustrating lithography mask formation in a method of manufacturing a semiconductor device, according to an exemplary embodiment of the present invention.

Referring to FIG. 3, a mask 135 is formed on the dielectric layer 116. The mask 135 includes an opening corresponding to the vertical transistor structure in the NFET region and covers the vertical transistor structure in the PFET region. According to an embodiment, the mask 135 includes, but is not necessarily limited to, an organic planarization layer (OPL). The mask 135 is deposited using deposition techniques including, but not limited to, spin coating, CVD, PECVD, RFCVD, PVD, ALD, MLD, MBD, PLD, LSMCD, and/or sputtering. The OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art.

Figure 4:
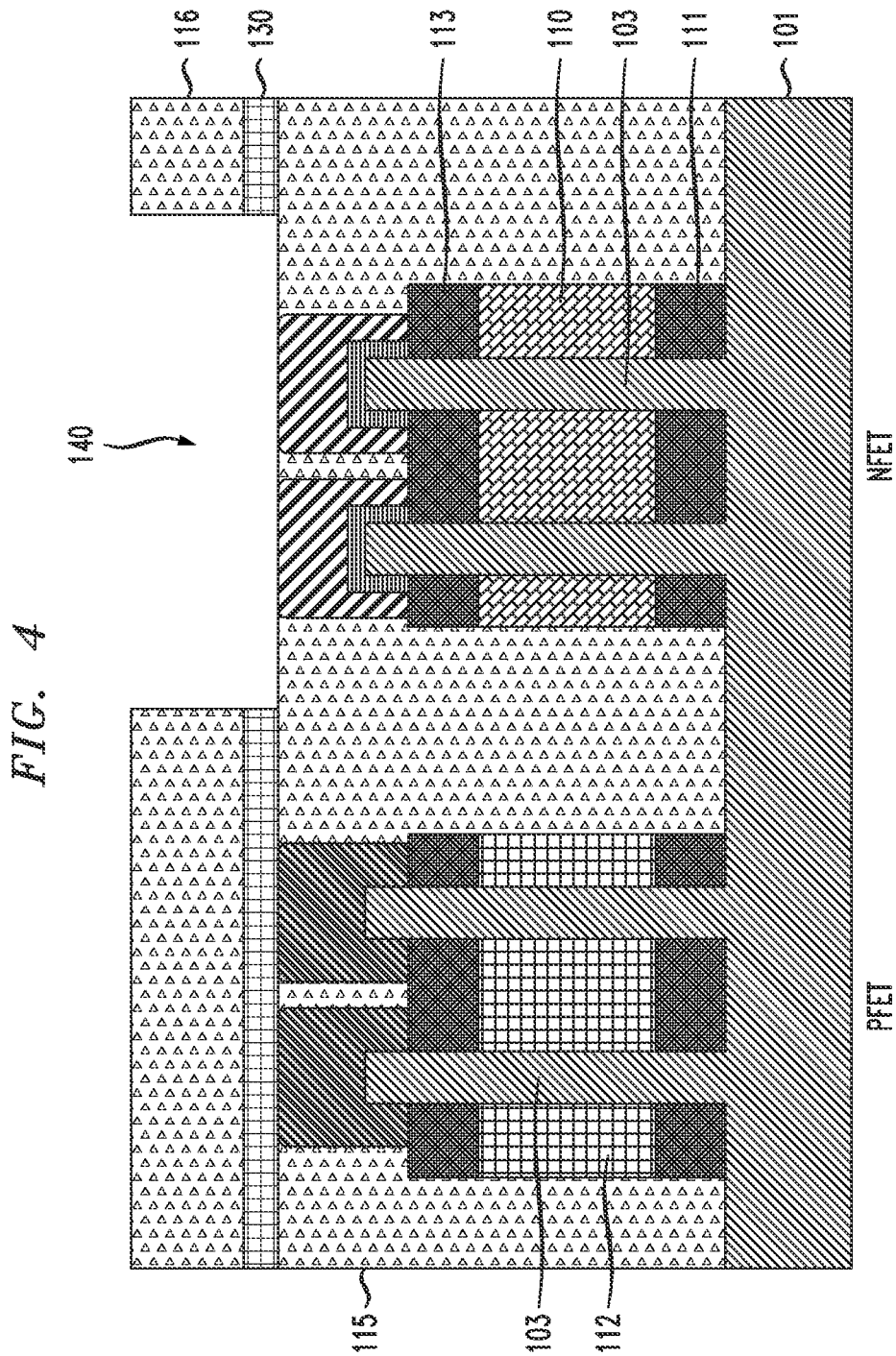
FIG. 4 is a cross-sectional view illustrating dielectric layer and liner removal in an NFET region in a method of manufacturing a semiconductor device, according to an exemplary embodiment of the present invention.

Referring to FIG. 4, exposed portions of the dielectric and liner layers 116 and 130 through the opening in the mask 135 are removed in an etching process. According to an embodiment, the etching process is a directional RIE process performed with, for example, $SF_6$, $CHF_3$, $CF_4$, or $BCl_3$. The removal of the exposed portions of the dielectric and liner layers 116 and 130 creates an opening 140 exposing top surfaces of the a-Si layer 120 of the dummy source/drain regions in the NFET region.

Figure 5:
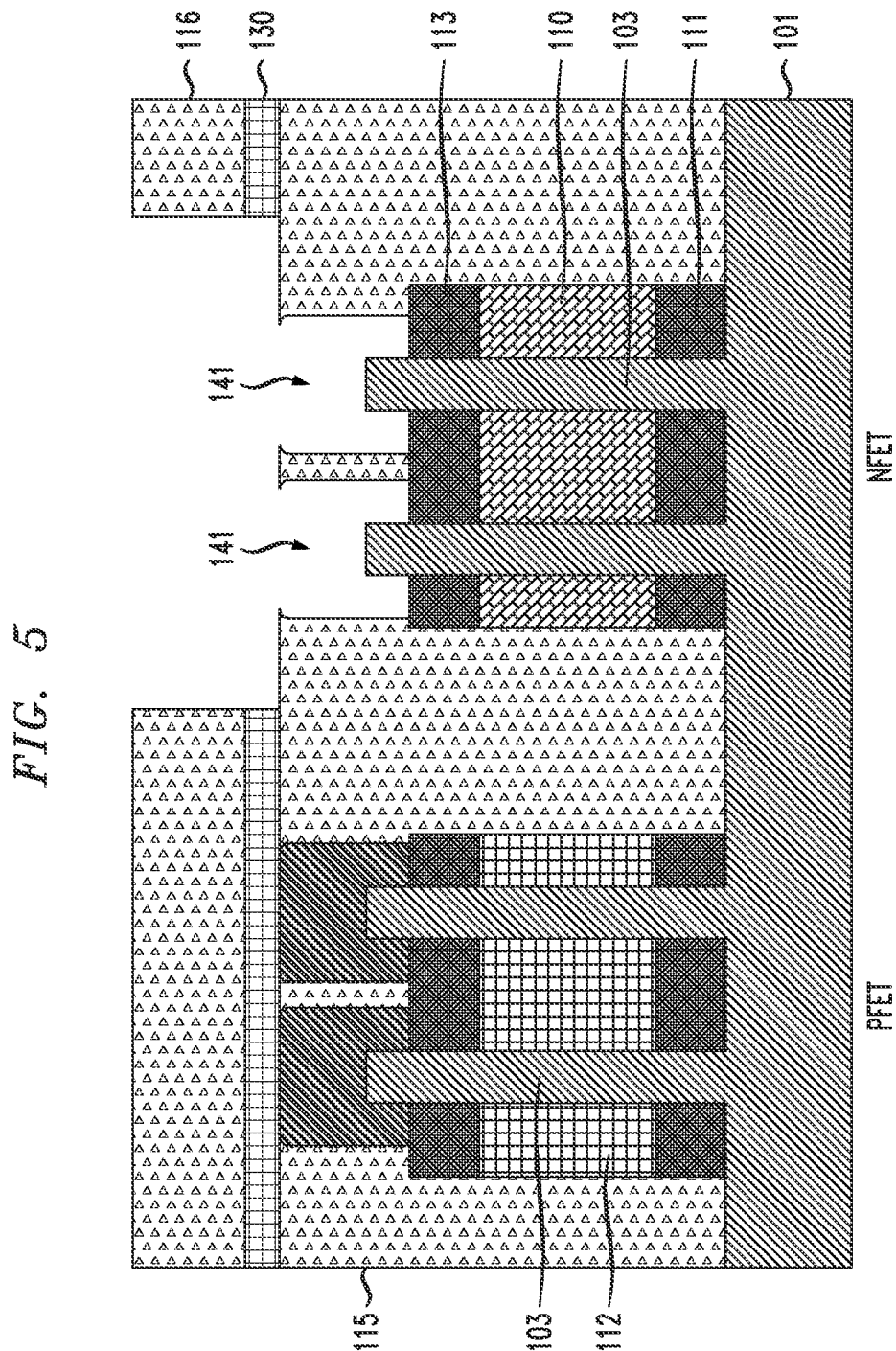
FIG. 5 is a cross-sectional view illustrating dummy source/drain region removal in a method of manufacturing a semiconductor device, according to an exemplary embodiment of the present invention.

Referring to FIG. 5, the dummy source/drain regions including the a-Si and dielectric layers 120 and 122 exposed by the opening 140 are removed to create vacancies over and around upper portions of the fins 103 in the NFET region. The removal of the dummy source/drain regions is performed using a dry or wet etching process. The dry etch is performed with, for example, $SF_6$, $CHF_3$, $CF_4$, or $BCl_3$ and the wet etch is performed with, for example, $NH_4OH$.

Figure 6:
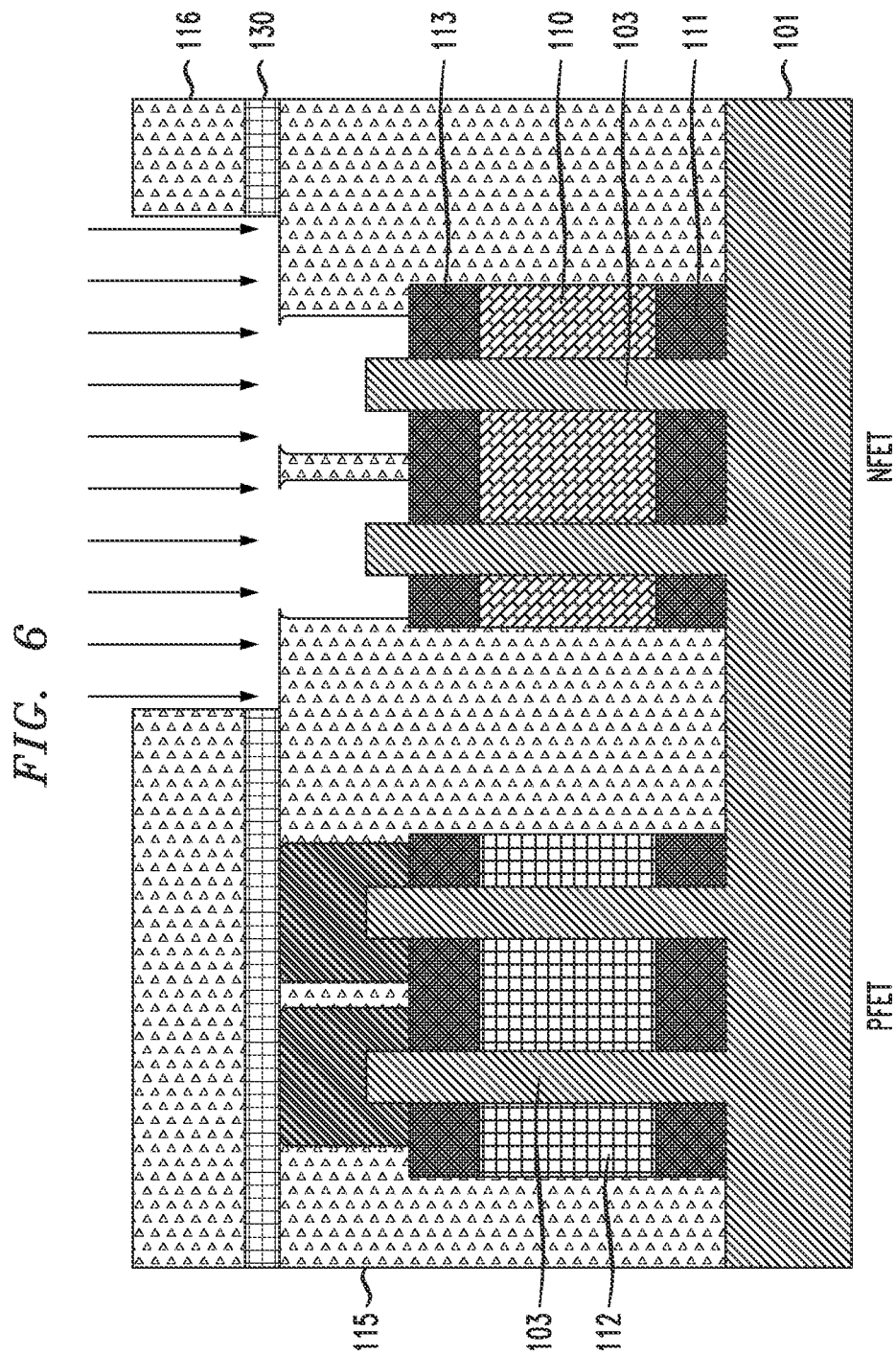
FIG. 6 is a cross-sectional view illustrating NFET junction ion implantation in a method of manufacturing a semiconductor device, according to an exemplary embodiment of the present invention.

Referring to FIG. 6, as shown by the arrows, a junction ion implantation process is performed in the NFET region to dope an upper portion the fins 103 in the NFET region. According to an embodiment, the ion implantation is performed with an n-type dopant selected from a group of phosphorus (P), arsenic (As) and antimony (Sb) at various concentrations. For example, in a non-limiting example, a dopant concentration range may be $1 \times 10^{18}/cm^3$ to $1 \times 10^{21}/cm^3$. Following ion implantation, an annealing process is performed to activate the dopants. The annealing process can be, for example, a drive-in annealing process performed at temperatures in the range of, for example, about 800° C. to 1300° C. and for durations in the range of, for example, about 0.01 seconds to 10 minutes. The annealing process can be performed using annealing techniques including, but not limited to, laser anneal, rapid thermal anneal, flash anneal, furnace anneal, or any suitable combination of those techniques. In some embodiments, the anneal process is omitted.

Figure 7:
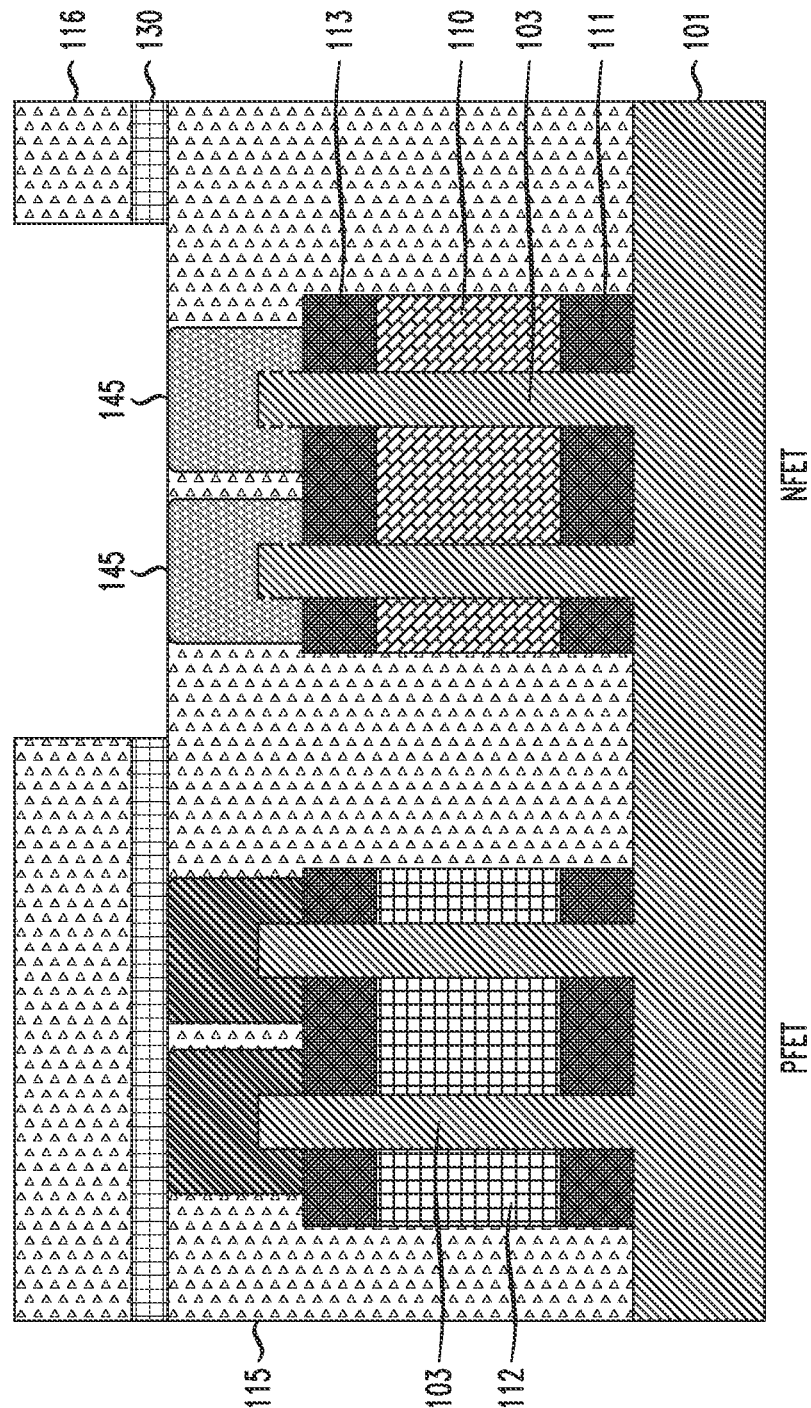
FIG. 7 is a cross-sectional view illustrating top source/drain region formation in method of manufacturing a semiconductor device, according to an exemplary embodiment of the present invention.

Referring to FIG. 7, top source/drain regions 145 are epitaxially grown from the upper portions of the doped fins 103 in the NFET region. The top source/drain regions 145 are in-situ doped and a following ion implantation of the top source/drain regions 145 may be performed. In a non-limiting example, a dopant concentration range may be $1 \times 10^{18}/cm^3$ to $1 \times 10^{21}/cm^3$, and the top source/drain regions 145 include phosphorous or arsenic doped silicon grown from phosphorous or arsenic doped silicon fins 103. Epitaxial growth is ceased when the top surface of the source/drain regions 145 is even with or near a top surface of the dielectric layer 115.

Figure 8:
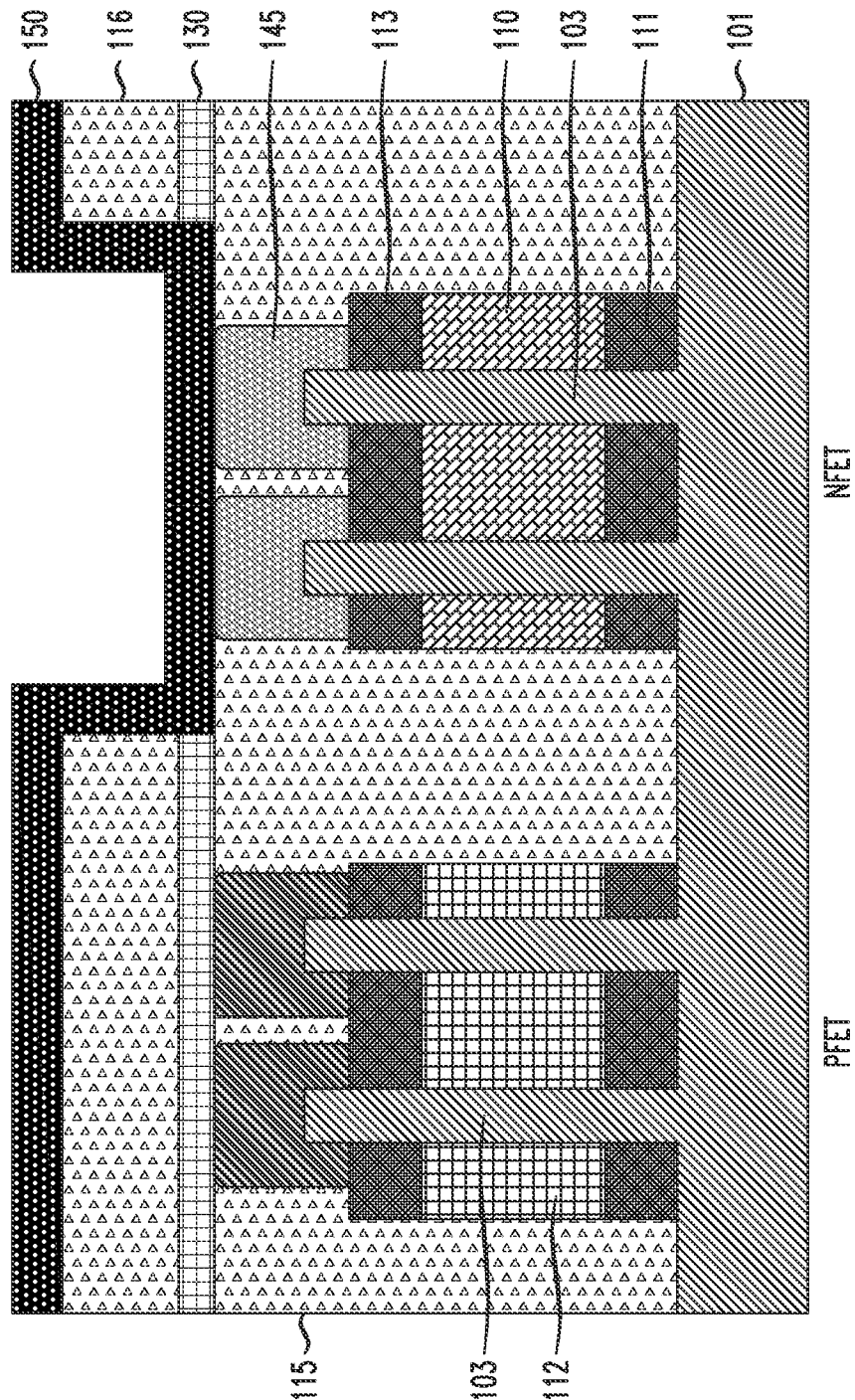
FIG. 8 is a cross-sectional view illustrating contact liner layer deposition in a method of manufacturing a semiconductor device, according to an exemplary embodiment of the present invention.

Referring to FIG. 8, a contact liner layer 150 is deposited on an upper surface of the dielectric layer 116 outside of the opening 140, and on side surfaces of the dielectric layer 116 and upper surfaces of the dielectric layer 115 and source/drain regions 145 in the opening 140. According to one or more embodiments, the contact liner layer 150 is deposited using a conformal deposition technique, such as, but not necessarily limited to, ALD or CVD, and the contact liner layer 150 includes a conductive material, such as, for example titanium (Ti), cobalt (Co), scandium (Sc), chromium (Cr). A thickness of the contact liner layer 150 with respect to underlying layers is about 10 angstroms to about 50 angstroms.

Figure 9:
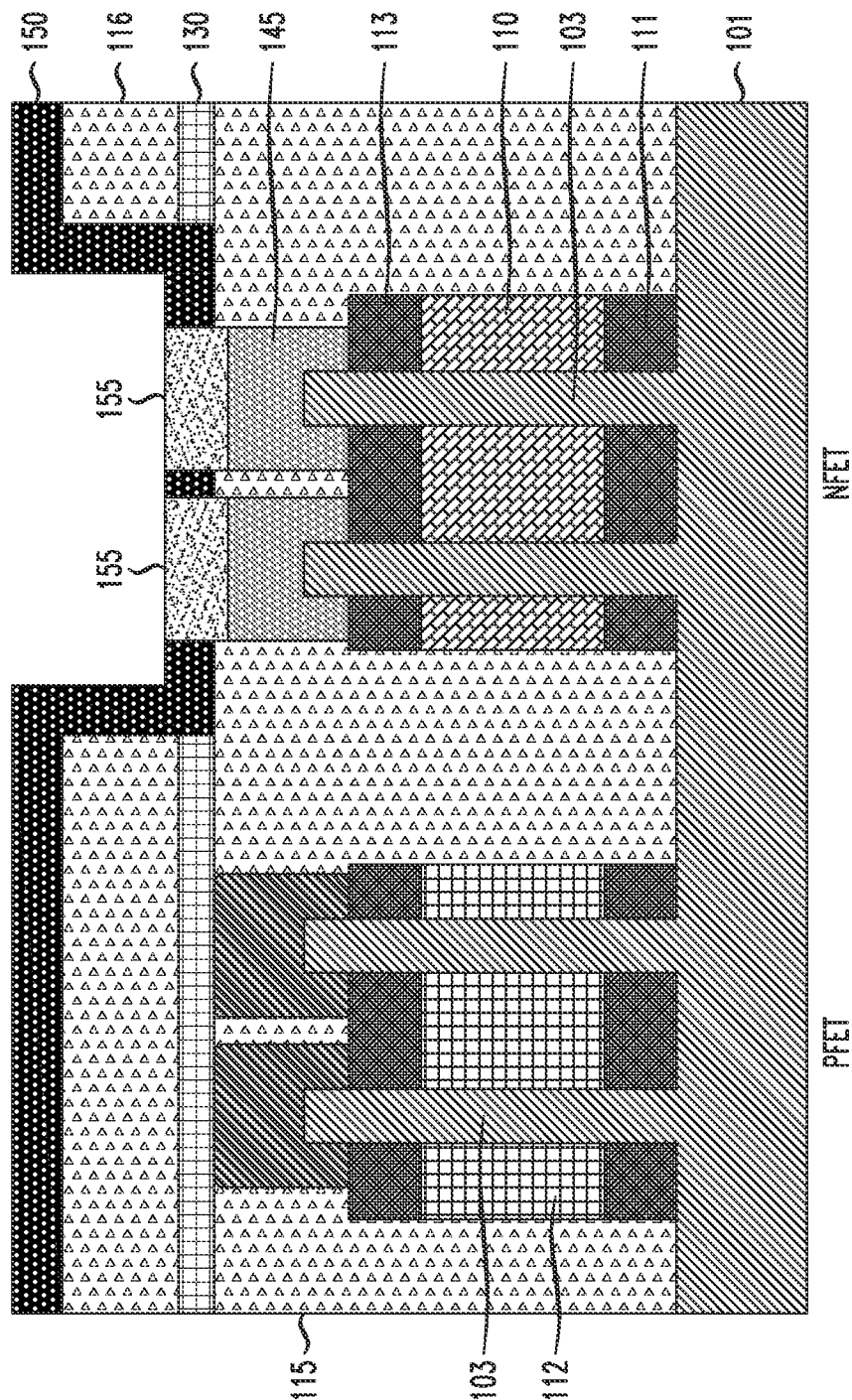
FIG. 9 is a cross-sectional view illustrating silicide formation in a method of manufacturing a semiconductor device, according to an exemplary embodiment of the present invention.

Referring to FIG. 9, an annealing process is performed to convert portions of the contact liner layer 150 on the top source/drain regions 145 into silicide portions 155. The annealing process causes silicidation, which is the formation of a silicide including a portion of a contact liner layer 150 with the underlying source/drain regions 145. The annealing process can be performed at temperatures in the range of, for example, about 800° C. to 1300° C. and for durations in the range of, for example, about 0.01 seconds to 10 minutes. The annealing techniques include, but are not limited to, laser anneal, rapid thermal processing (RTP), rapid thermal anneal, or any suitable combination of those techniques. In the case of a titanium contact liner layer, for example, the silicide portions 155 comprise titanium silicide. Alternatively, the silicide portions 155 may include cobalt silicide, scandium silicide or chromium silicide.

Figure 10:
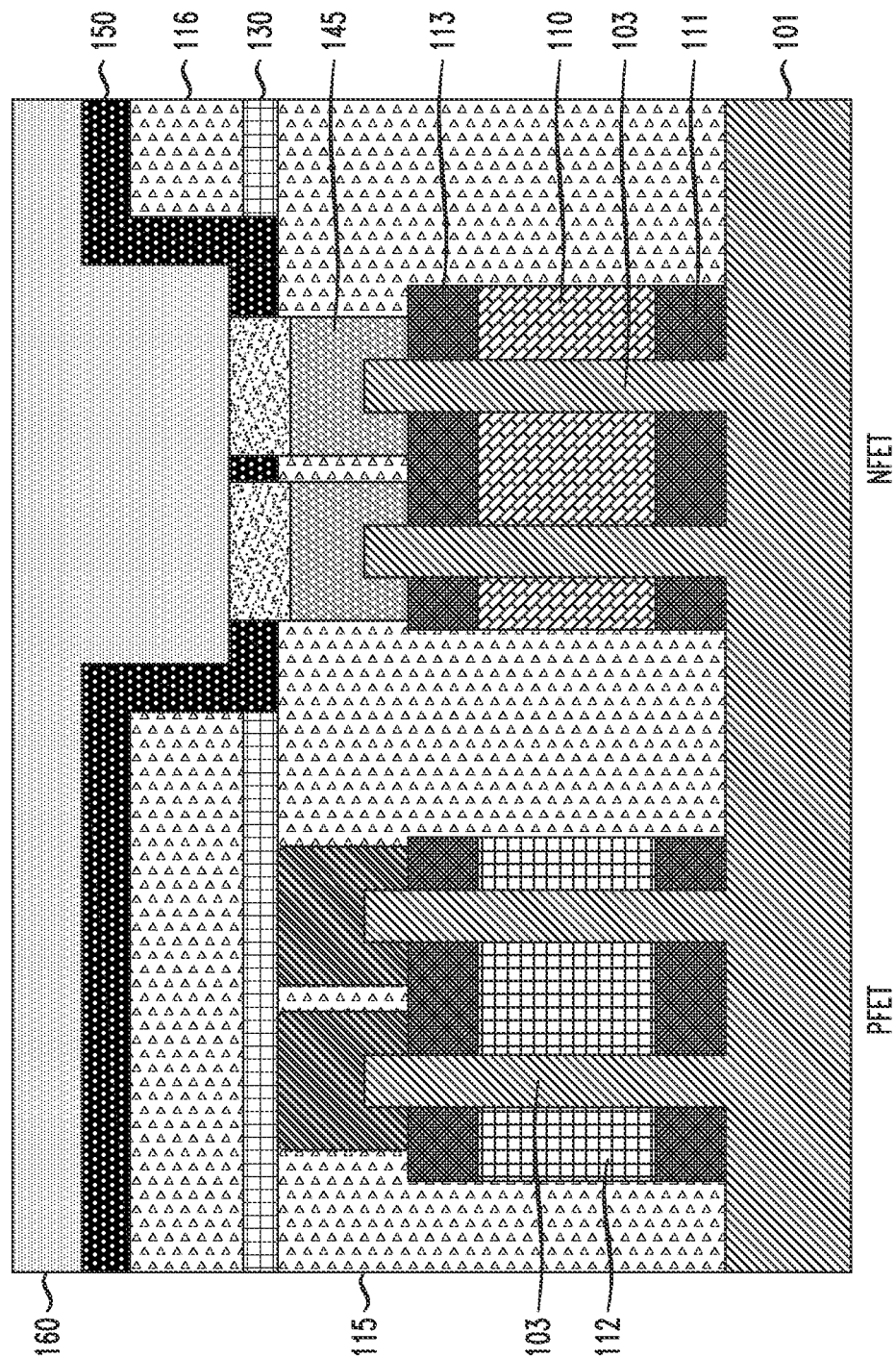
FIG. 10 is a cross-sectional view illustrating organic planarization layer (OPL) formation in a method of manufacturing a semiconductor device, according to an exemplary embodiment of the present invention.
Figure 11:
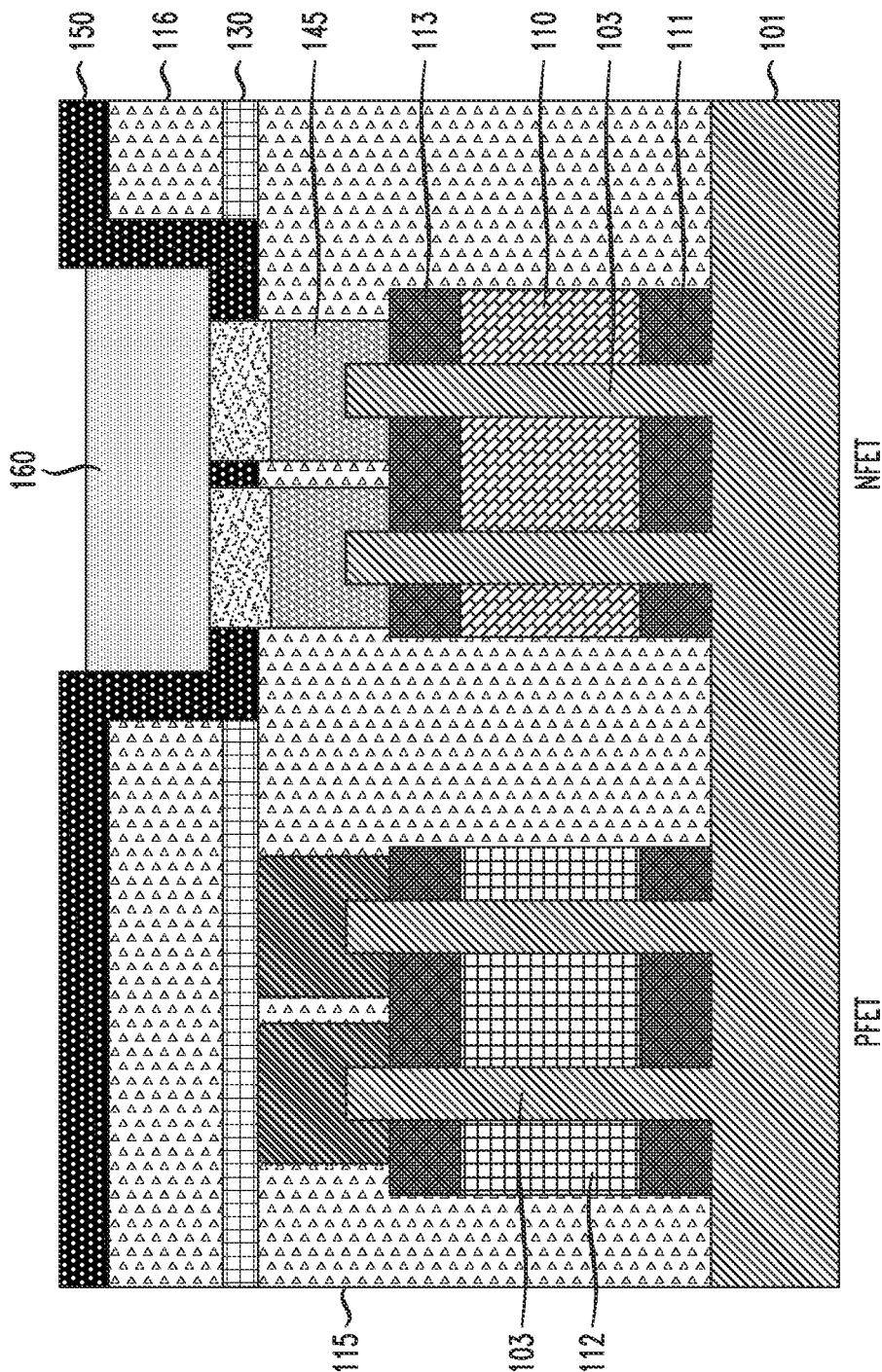
FIG. 11 is a cross-sectional view illustrating OPL recessing in a method of manufacturing a semiconductor device, according to an exemplary embodiment of the present invention.

Referring to FIGS. 10 and 11, in accordance with one or more embodiments, an OPL 160 is formed on exposed portions of the contact liner layer 150 and the silicide portions 155, and then recessed. Referring to FIG. 10, the OPL 160 fills in a remainder of the opening 140 and is stacked on the contact liner layer 150 outside of the opening 140. The OPL 160 can be deposited, for example, by spin coating, CVD, PECVD, RFCVD, PVD, ALD, MLD, MBD, PLD, LSMCD, and/or sputtering. The OPL material may be an organic polymer including C, H, and N. In an embodiment, the OPL material can be free of Si. According to an embodiment, the OPL material can be free of Si and F.

As shown in FIG. 11, the OPL 160 is recessed to a height below a top surface of the contact liner layer 150 on the dielectric layer 116. According to one or more embodiments, the height of the recessed OPL 160 is above an upper surface of the dielectric layer 116 in order to protect portions of the contact liner layer 150 in the opening 140 during subsequent removal of other portions of the contact liner layer 150 described in connection with FIG. 12. The OPL 160 is recessed using a wet or dry etching process that is selective with respect to a material of the contact liner layer 150. Etch chemistry for recessing the OPL 160 can include, for example, oxygen plasma or a plasma containing nitrogen $(N_2))$/hydrogen $(H_2)$.

Figure 12:
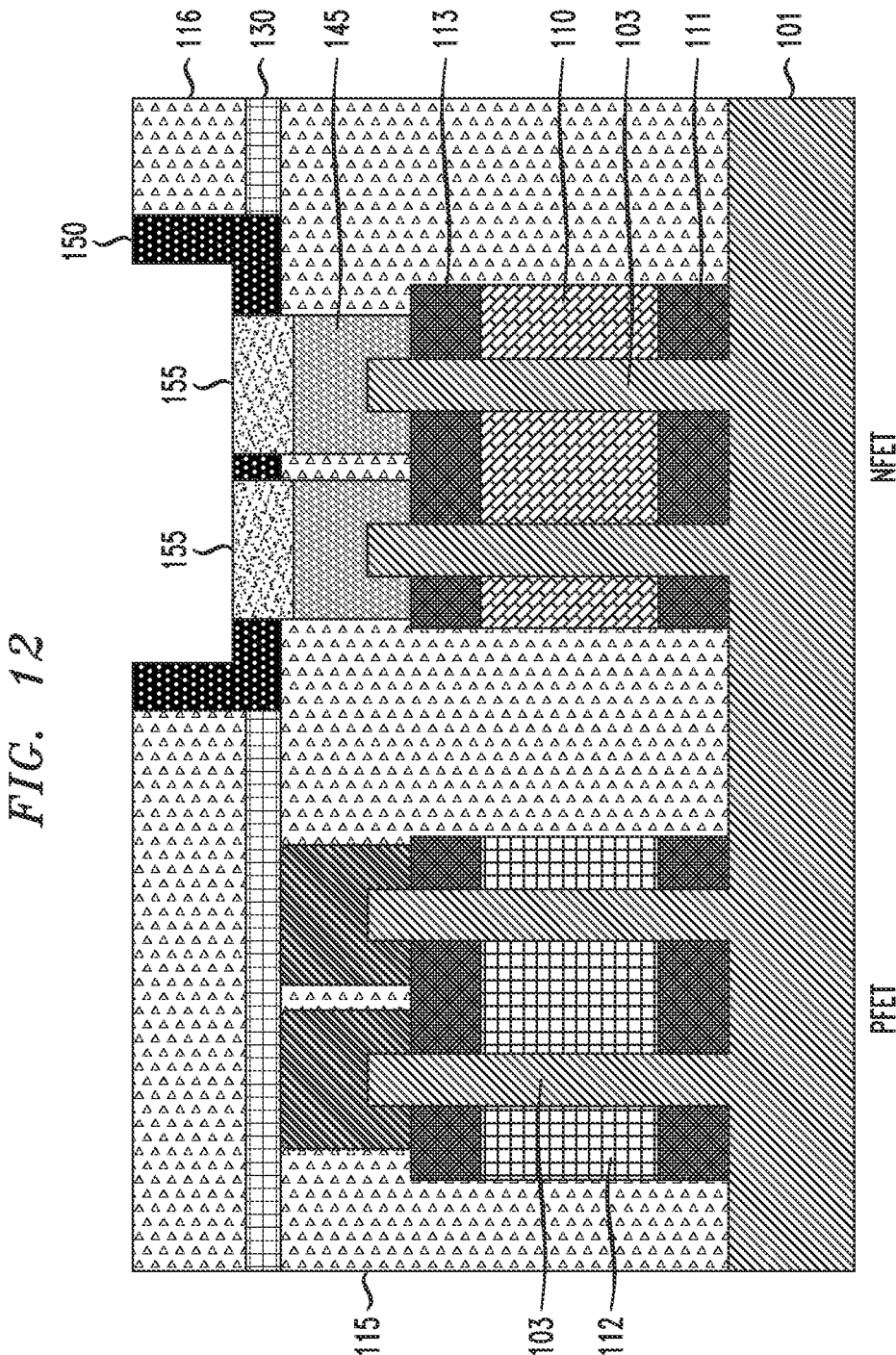
FIG. 12 is a cross-sectional view illustrating removal of the OPL and portions of the contact liner layer in a method of manufacturing a semiconductor device, according to an exemplary embodiment of the present invention.

Referring to FIG. 12, portions of the contact liner layer 150 on the upper surface of the dielectric layer 116 outside of the opening 140 are selectively removed with respect to the OPL 160. Removal of the portions of the contact liner layer 150 can be performed using a wet chemistry etch with, for example, HF or nitric acid. During removal of the portions of the contact liner layer 150, the silicide portions 155 and the parts of the contact liner layer 150 lining the surfaces of the opening 140 are protected by the OPL 160 so that the silicide portions 155 and the parts of the contact liner layer 150 lining the surfaces of the opening 140 remain. As noted above in connection with FIG. 11, the height of the recessed OPL 160 is above an upper surface of the dielectric layer 116 in order to protect portions of the contact liner layer 150 in the opening 140 during removal of the portions of the contact liner layer 150 on the upper surface of the dielectric layer 116 outside of the opening 140.

Following removal of the select portions of the contact liner layer 150, the remaining OPL 160 is removed. The OPL 160 is stripped using, for example, oxygen plasma, nitrogen/hydrogen plasma or other carbon strip process. OPL stripping causes minimal or no damage to exposed layers.

Figure 13:
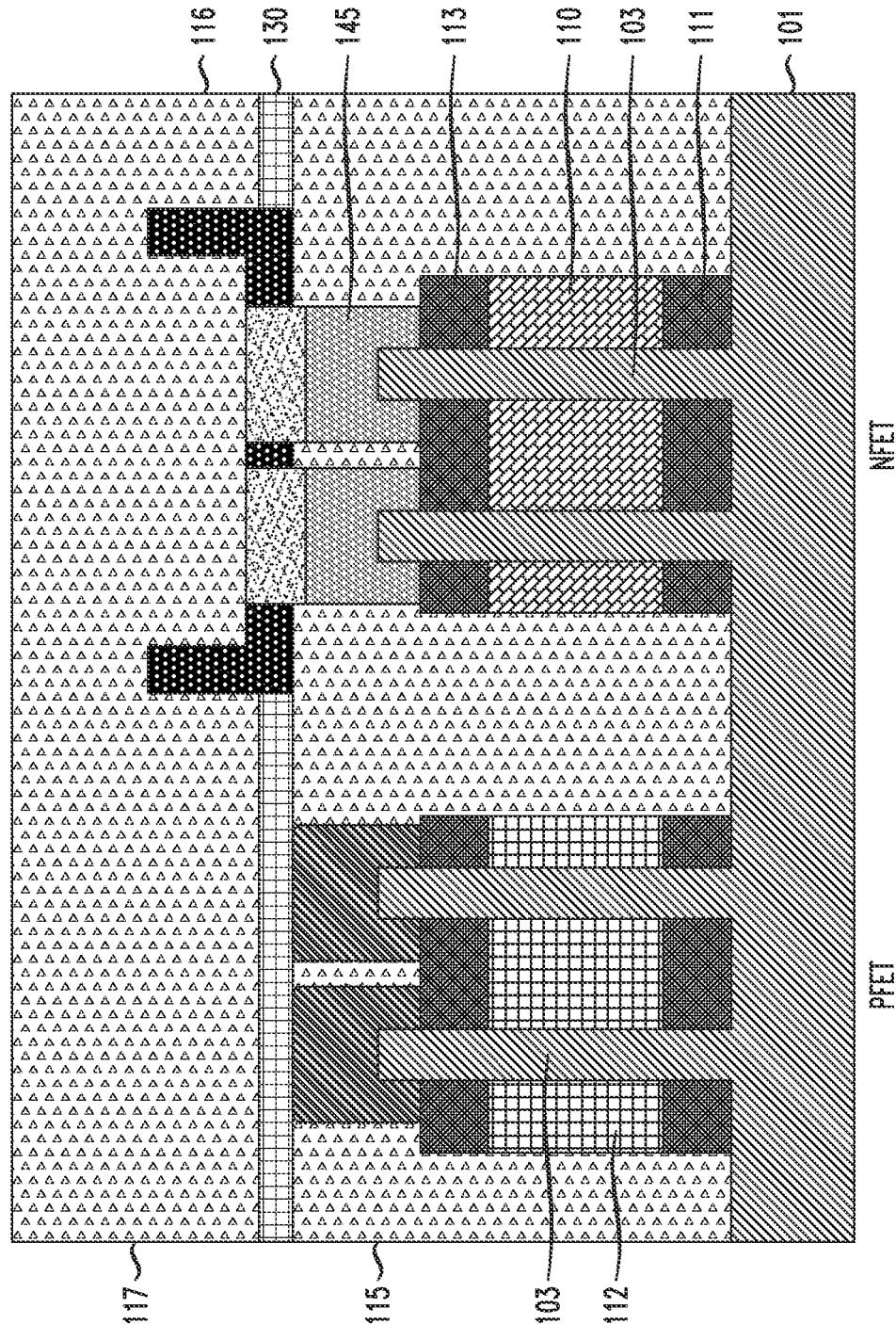
FIG. 13 is a cross-sectional view illustrating contact area dielectric layer formation in a method of manufacturing a semiconductor device, according to an exemplary embodiment of the present invention.

Referring to FIG. 13, a contact area dielectric layer 117 is deposited on the structure from FIG. 12. Specifically, the contact area dielectric layer 117 is deposited on the dielectric layer 116, and in the opening 140 on the contact liner layer 150 and the silicide portions 155. The contact area dielectric layer 117 includes, but is not necessarily limited to, the same or similar material as the dielectric layers 115 and/or 116, and can be deposited using the same or similar deposition techniques as used for the dielectric layers 115 and/or 116, followed by a planarization process, such as, CMP.

Figure 14:
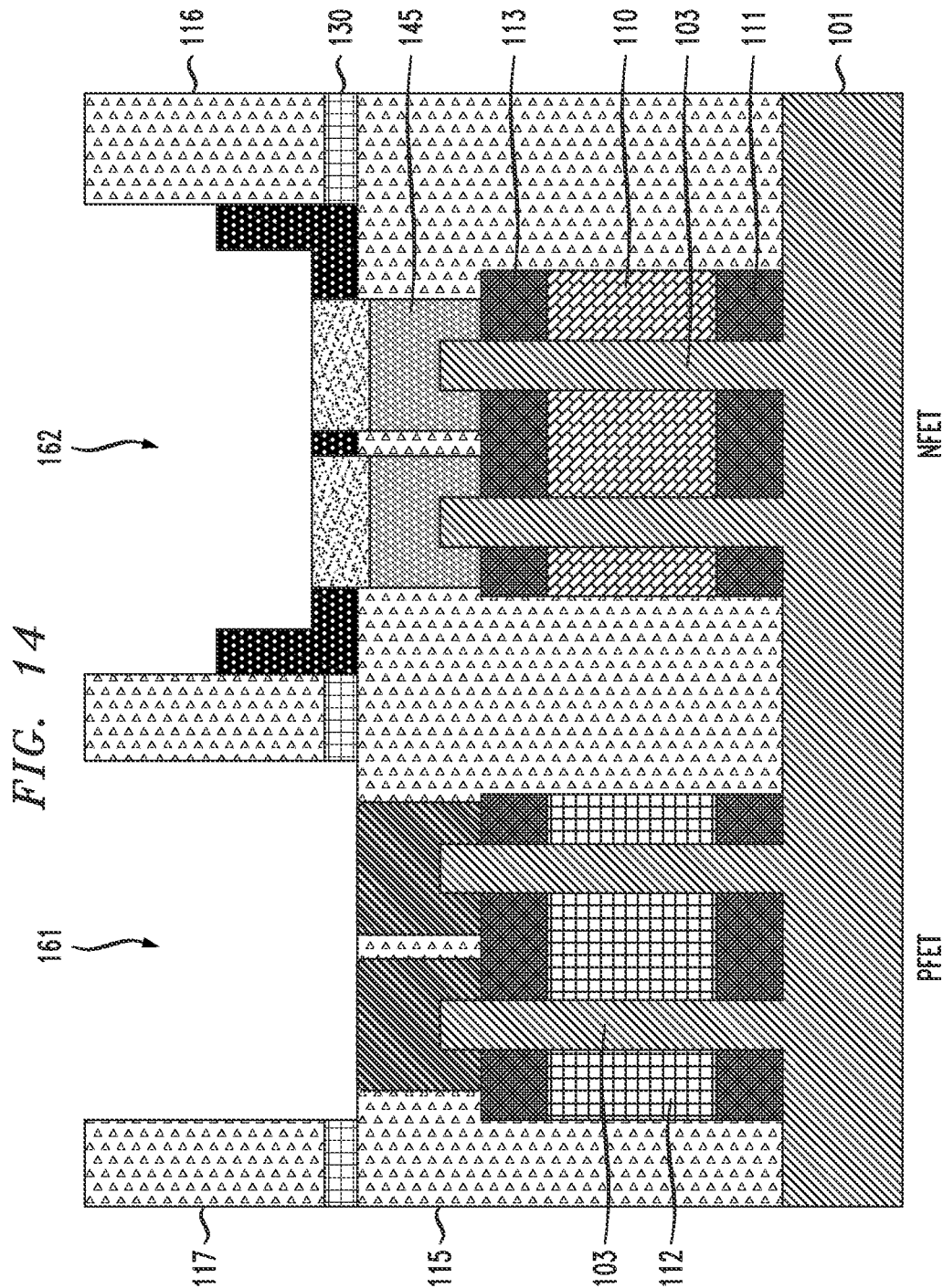
FIG. 14 is a cross-sectional view illustrating contact area patterning in a method of manufacturing a semiconductor device, according to an exemplary embodiment of the present invention.

Referring to FIG. 14, a mask (not shown) having openings exposing areas corresponding to the top source/drain regions 125 and 145 in the PFET and NFET regions is formed on the dielectric layer 117. The mask is comprised of the same or similar materials to that of the mask 135. Exposed portions of the dielectric and liner layers 117, 116 and 130 through the opening in the mask are removed in an etching process to create openings 161 and 162 exposing the top source/drain region 125 and the silicide portions 155, as well as the remaining contact liner layer 150. According to an embodiment, the etching process is a directional RIE process performed with, for example, $SF_6$, $CHF_3$, $CF_4$, or $BCl_3$.

Figure 15:
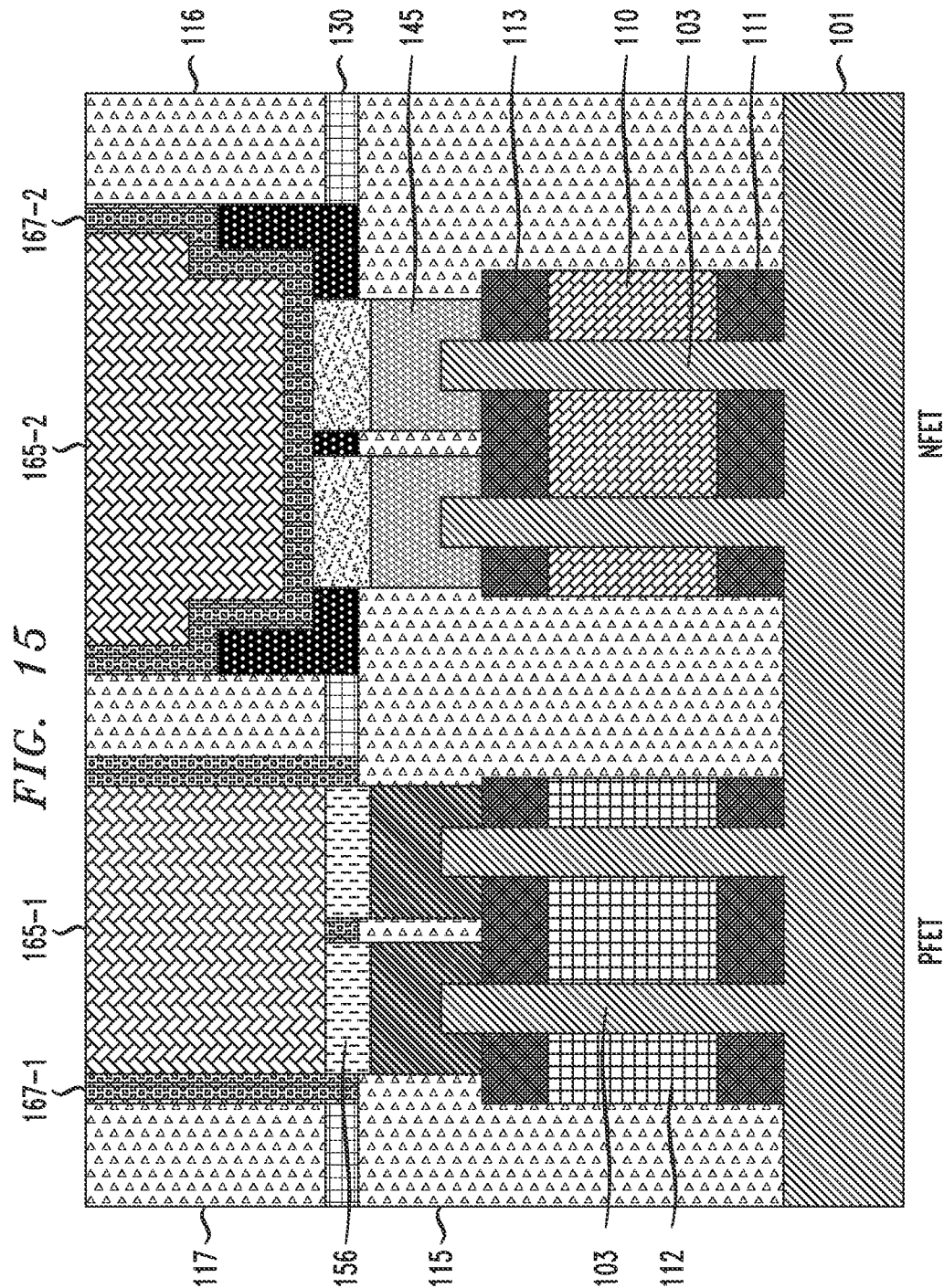
FIG. 15 is a cross-sectional view illustrating source/drain region contact formation in a method of manufacturing a semiconductor device, according to an exemplary embodiment of the present invention.

Referring to FIG. 15, top source/drain contacts are formed in PFET and NFET regions. The top source/drain contacts each include a contact liner layer 167-1 or 167-2 and a conductive layer 165-1 or 165-2. According to an embodiment, the contact liner layers 167-1 and 167-2 include, for example, nickel (Ni) or platinum (Pt), and are formed on side and bottom surfaces of the openings 161 and 162 including on the top source/drain regions 125 and 145, respectively. The contact liner layers 167-1 and 167-2 are formed before filling the openings 161 and 162 with the conductive layers 165-1 and 165-2, respectively. In the PFET region, the contact liner layer 167-1 is formed directly on the source/drain regions 125. The portion of the contact liner layer 167-1 formed on the source/drain regions 125 is converted into silicide portions 156. Similar to the annealing process described in connection with FIG. 9, an annealing process is performed to convert portions of the contact liner layer 167-1 on the top source/drain regions 125 into the silicide portions 156. The annealing process causes silicidation, which is the formation of a silicide including a portion of the contact liner layer 167-1 with the underlying source/drain regions 125. In the case of a nickel or platinum contact liner layer, for example, the silicide portions 156 comprise nickel or platinum silicide, which is a different composition than that of the silicide portions 155, which comprise, for example, titanium silicide, cobalt silicide, scandium silicide or chromium silicide. As can be understood, the silicide portions 155 are based on a different contact liner material (e.g., Ti, Co, Sc, Cr) and are formed earlier in the process flow than the silicide portions 156, which are based on, for example, Ni or Pt contact liner material. The annealing process to form the silicide portions 156 does not form additional silicide portions from the contact liner layer 167-2 in the NFET region since the contact liner layer 167-2 is not in contact with the epitaxial source/drain regions 145, and instead contacts another metal (e.g., titanium contact liner 150) or the previously formed silicide portions 155.

Following formation of the silicide portions 156, the conductive layers 165-1 and 165-2 are deposited on the contact liner layers 167-1 and 167-2 to fill in the openings 161 and 162, respectively. In the PFET region, the conductive layer 165-1 is also deposited directly on the silicide portions 156. In the NFET region, the contact liner layer 167-2 is an intervening layer between the silicide portions 155 and the conductive layer 165-2. The conductive layers 165-1 and 165-2 include, for example, electrically conductive material including, but not necessarily limited to, tungsten, cobalt, zirconium, tantalum, titanium, aluminum, ruthenium, and/or copper.

Deposition of the conductive layers 165-1 and 165-2 can be performed using one or more deposition techniques, including, but not necessarily limited to, CVD, PECVD, PVD, ALD, MBD, PLD, LSMCD, and/or spin-on coating. Deposition of the contact liner layers 167-1 and 167-2 can be performed using a conformal deposition technique, such as, for example, ALD or CVD. Deposition of the conductive layers 165-1 and 165-2, and of the contact liner layers 167-1 and 167-2 may be followed by planarization using a planarization process, such as, for example, CMP.

Figure 16:
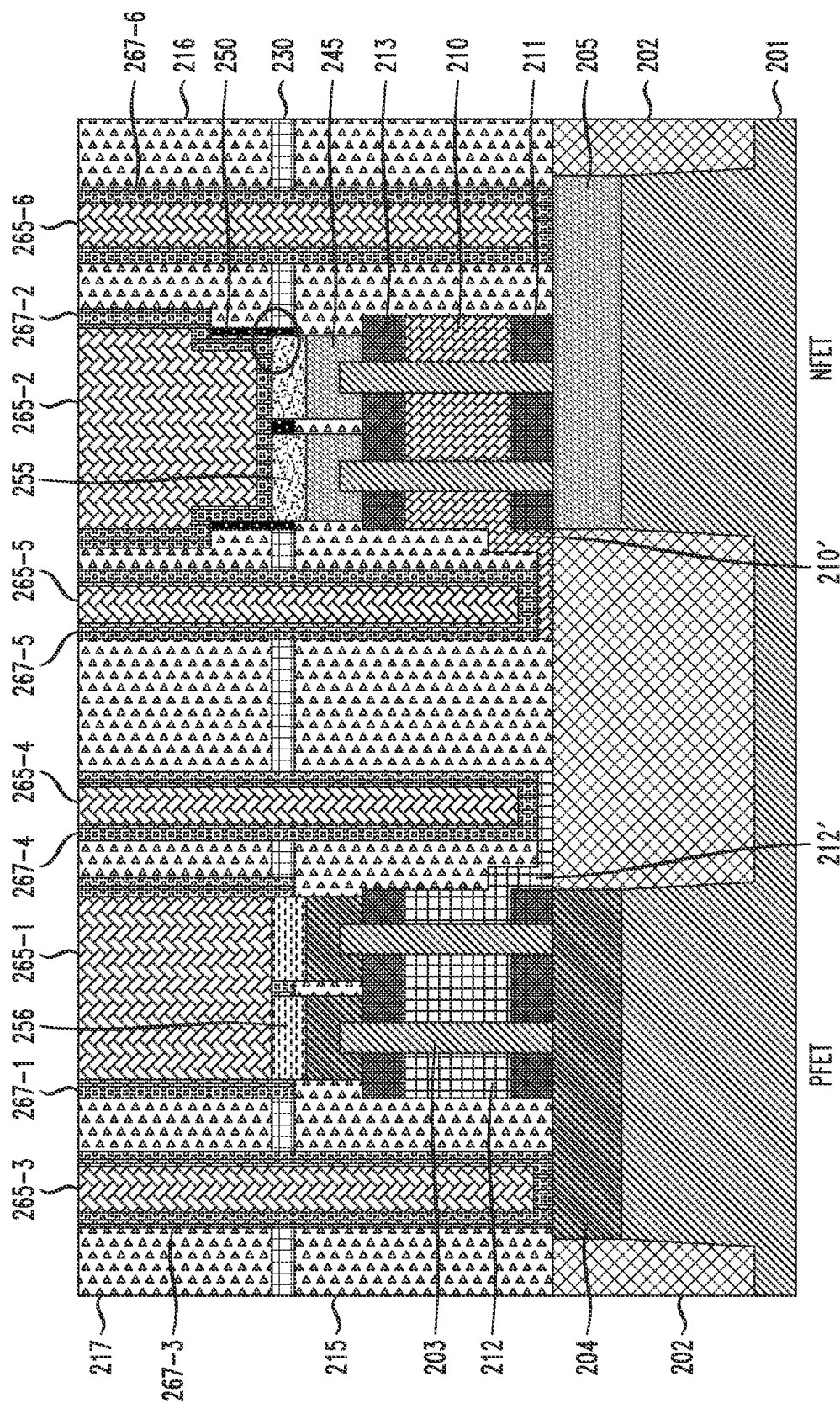
FIG. 16 is a cross-sectional view illustrating a semiconductor device manufactured according to an exemplary embodiment of the present invention.

Referring to FIG. 16, a semiconductor device 200 includes the vertical transistor structures manufactured in accordance with the steps described in connection with FIGS. 1-15. Similar reference numerals in FIG. 16 to those used in FIGS. 1-15 refer to the same or similar elements. For example, like the corresponding elements 101, 103, 110, 111, 112, 113, 115, 116, 117, 125, 130, 145, 150, 155, 156, 165-1, 165-2, 167-1 and 167-2, the semiconductor device 200 includes a semiconductor substrate 201, fins 203, gate metal layers 210 and 212, spacer layers 211 and 213, dielectric layers 215, 216 and 217, dielectric liner layer 230, source/drain regions 225 and 245, contact liner layer 250, silicide portions 255 and 256, conductive layers 265-1 and 265-2, and contact liner layers 267-1 and 267-2. The elements 201, 203, 210, 211, 212, 213, 215, 216, 217, 225, 230, 245, 250, 255, 256, 265-1, 265-2, 267-1 and 267-2 are the same or substantially the same as the corresponding elements in, for example, FIG. 15, and are manufactured using the same or similar processes as described in connection with FIGS. 1-15.

The semiconductor device 200 also includes isolation regions 202 (e.g., shallow trench isolation (STI) regions) formed in recessed portions of the substrate 201. The isolation regions 202 include dielectric material, such as, but not necessarily limited to, $SiO_x$, SiOC, SiOCN or some other dielectric. A bottom source/drain region 204 including, for example, boron doped SiGe (SiGe:B), and a bottom source/drain contact including conductive layer 265-3 and contact liner layer 267-3 are formed in a PFET region of the device 200. Other p-type dopants may include Ga, In, and Tl. A bottom source/drain region 205 including, for example, phosphorous doped Si (Si:P), and a bottom source/drain contact including conductive layer 265-6 and contact liner layer 267-6 are formed in an NFET region of the device 200. Other n-type dopants may include As and Sb. In a non-limiting example, a dopant concentration range for the bottom source/drain regions 204 and 205 may be $1\times10^{18}/cm^3$ to $1\times10^{21}/cm^3$.

The device 200 further includes a gate contact including conductive layer 265-4 and contact liner layer 267-4 formed in the PFET region, and a gate contact including conductive layer 265-5 and contact liner layer 267-5 formed in the NFET region. The bottom source/drain and gate contacts extend through the layers 217, 216, 230 and 215. The bottom source/drain contacts contact the bottom source/drain regions 204 and 205, and the gate contacts contact gate metal portions 210' and 212' extending from the gate metal layers 210 and 212. Similar to the conductive layers 265-1 and 265-2, the conductive layers 265-3 to 265-6 include, for example, electrically conductive material including, but not necessarily limited to, tungsten, cobalt, zirconium, tantalum, titanium, aluminum, ruthenium, and/or copper. Similar to the contact liner layers 267-1 and 267-2, the contact liner layers 267-3 to 267-6 include, for example, Ni or Pt.

According to one or more embodiments, ion implantation, epitaxial growth of source/drain regions and silicide formation follow dielectric layer patterning with a single mask 135 as described in connection with FIGS. 3-5. In addition, the silicide portions 155/255 formed in the NFET region are formed during different steps and are based on different material (e.g., the material of contact liner layer 150) than the silicide portions 156/256 in the PFET region, which are based on the material of the contact liner layer 167-1/267-2 (e.g., Ni or Pt). As can be seen by the circled portion in FIG. 16, the contact to the source/drain regions 245 includes the conductive layer 265-2 on contact liner layer 267-2, and the contact liner layer 267-2 on silicide portions 255 and on remaining portions of the contact liner layer 250.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
 a first vertical transistor structure in a first device region on a substrate, wherein the first vertical transistor structure comprises a first plurality of fins;
 a second vertical transistor structure in a second device region on the substrate, wherein the second vertical transistor structure comprises a second plurality of fins;
 a plurality of first source/drain regions on upper portions of the first plurality of fins;
 a plurality of second source/drain regions on upper portions of the second plurality of fins;
 a plurality of first silicide portions on the plurality of first source/drain regions;

a plurality of second silicide portions on the plurality of second source/drain regions;
a first contact liner layer disposed on the plurality of first silicide portions;
a first conductive layer disposed on the first contact liner layer;
wherein the first contact liner layer is positioned between the first conductive layer and the plurality of first silicide portions;
a second conductive layer disposed directly on the plurality of second silicide portions; and
a second contact liner layer disposed on lateral sides of the second conductive layer and of the plurality of second silicide portions;
wherein the plurality of second silicide portions have a different composition than the plurality of first silicide portions; and
wherein the first and second device regions respectively comprise n-type and p-type transistor regions.

2. The semiconductor device according to claim 1, wherein a bottom surface of the first contact liner layer contacts top surfaces of the plurality of first silicide portions.

3. The semiconductor device according to claim 1, wherein a bottom surface of the second conductive layer contacts top surfaces of the plurality of second silicide portions.

4. The semiconductor device according to claim 1, further comprising a third contact liner layer disposed adjacent the first contact liner layer and the plurality of first silicide portions.

5. The semiconductor device according to claim 4, wherein the first contact liner layer and the third contact liner layer comprise different materials from each other.

6. The semiconductor device according to claim 4, wherein a portion of the first contact liner layer is disposed on the third contact liner layer.

7. The semiconductor device according to claim 6, wherein the portion of the first contact liner layer disposed on the third contact liner layer is formed in a stepped shape.

8. The semiconductor device according to claim 4, wherein the third contact liner layer comprises an L-shape.

9. The semiconductor device according to claim 1, wherein the plurality of first silicide portions comprise at least one of titanium, cobalt, scandium, and chromium.

10. The semiconductor device according to claim 9, wherein the plurality of second silicide portions comprise at least one of nickel and platinum.

11. A semiconductor device, comprising:
a first vertical transistor structure in a first device region on a substrate;
a second vertical transistor structure in a second device region on the substrate;
a plurality of first top source/drain regions on upper portions of the first vertical transistor structure;
a plurality of second top source/drain regions on upper portions of the second vertical transistor structure;
a plurality of first silicide portions on the plurality of first top source/drain regions;
a plurality of second silicide portions on the plurality of second top source/drain regions;
a first contact liner layer disposed on the plurality of first silicide portions;
a first conductive layer disposed on the first contact liner layer;
wherein the first contact liner layer is positioned between the first conductive layer and the plurality of first silicide portions;
a second conductive layer disposed directly on the plurality of second silicide portions; and
a second contact liner layer disposed on lateral sides of the second conductive layer and of the plurality of second silicide portions;
wherein the plurality of second silicide portions have a different composition than the plurality of first silicide portions.

12. The semiconductor device according to claim 11, wherein a bottom surface of the first contact liner layer contacts top surfaces of the plurality of first silicide portions.

13. The semiconductor device according to claim 11, wherein a bottom surface of the second conductive layer contacts top surfaces of the plurality of second silicide portions.

14. The semiconductor device according to claim 11, further comprising a third contact liner layer disposed adjacent the first contact liner layer and the plurality of first silicide portions.

15. The semiconductor device according to claim 14, wherein the first contact liner layer and the third contact liner layer comprise different materials from each other.

16. The semiconductor device according to claim 14, wherein a portion of the first contact liner layer is disposed on the third contact liner layer.

17. The semiconductor device according to claim 16, wherein the portion of the first contact liner layer disposed on the third contact liner layer is formed in a stepped shape.

18. The semiconductor device according to claim 14, wherein the third contact liner layer comprises an L-shape.

19. The semiconductor device according to claim 11, wherein the plurality of first silicide portions comprise at least one of titanium, cobalt, scandium, and chromium.

20. The semiconductor device according to claim 19, wherein the plurality of second silicide portions comprise at least one of nickel and platinum.

* * * * *